United States Patent [19]

Shalaby

[11] Patent Number: 5,695,827
[45] Date of Patent: Dec. 9, 1997

[54] SURFACE PROTECTION OF GAMMA AND ALPHA-2 TITANIUM ALUMINIDES BY ION IMPLANTATION

[75] Inventor: Hoda Shalaby, Arcadia, Calif.

[73] Assignee: Boeing North American, Inc., Seal Beach, Calif.

[21] Appl. No.: 724,081

[22] Filed: Jul. 1, 1991

[51] Int. Cl.$^6$ .................. B05D 3/06; C23C 8/06
[52] U.S. Cl. .................. 427/528; 427/529; 427/530; 427/531; 148/277; 148/279; 148/281; 148/285
[58] Field of Search .................. 427/38, 528, 529, 427/530, 531; 148/276, 277, 279, 281, 284, 285, DIG. 83, DIG. 84, DIG. 82

[56] References Cited

U.S. PATENT DOCUMENTS

| | | | |
|---|---|---|---|
| 4,289,544 | 9/1981 | Dearnaley | 148/4 |
| 4,364,969 | 12/1982 | Dearnaley et al. | 427/38 |
| 4,433,005 | 2/1984 | Manty et al. | 427/38 |
| 4,465,524 | 8/1984 | Dearnaley et al. | 148/4 |
| 4,568,396 | 2/1986 | Vardiman | 148/133 |
| 4,701,301 | 10/1987 | Kuwahara et al. | 427/38 |
| 5,049,418 | 9/1991 | Tobin | 427/250 |
| 5,077,140 | 12/1991 | Luthra et al. | 427/34 |

FOREIGN PATENT DOCUMENTS

| | | | |
|---|---|---|---|
| 2-11753 | 1/1990 | Japan . | |
| 3-177570 | 8/1991 | Japan | 427/528 |

OTHER PUBLICATIONS

Pons et al "Oxidation of ion–implanted Ti in the 750°–950° C. Range" *J. of Less–Commun–Metals*, vol. 109 (1985 (no month)) pp. 45–56.

*Primary Examiner*—Marianne Padgett
*Attorney, Agent, or Firm*—Lawrence N. Ginsberg; Charles T. Silberberg

[57] ABSTRACT

A process invention for protecting alpha-2 and gamma titanium aluminide alloy specimens subjected to high temperature oxidation comprises providing an ion beam having an energy range from about 100 keV to about 170 keV. The ion beam incorporates an elemental species capable of promoting alumina formation. The ion beam is exposed to the specimen so as to implant a dose in a range from about $2 \times 10^{16}$ to about $8 \times 10^{17}$ ions/cm$^2$ for a sufficient time period to form a surface alloy of the elemental species and titanium aluminide near the surface of the specimen.

14 Claims, 1 Drawing Sheet

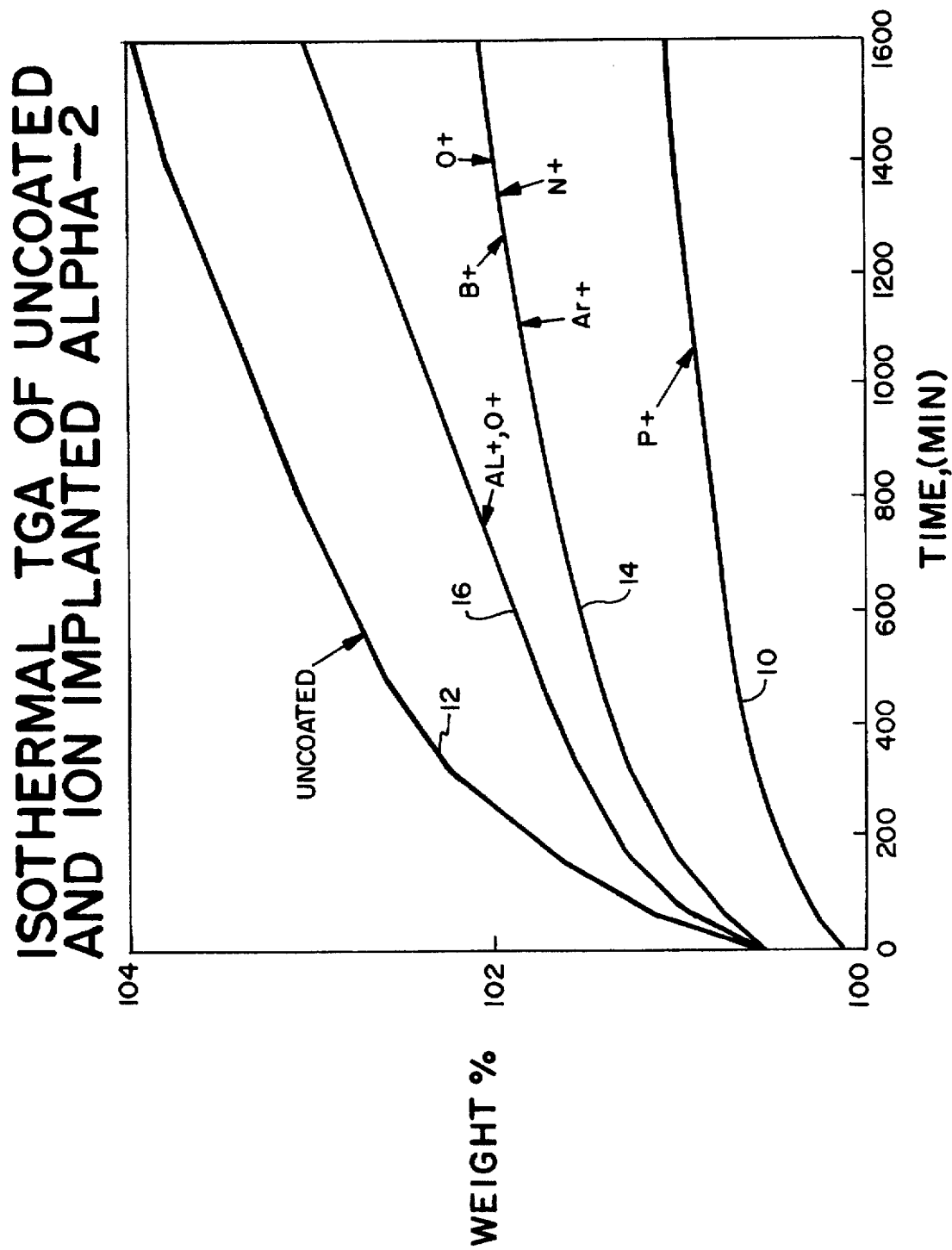

SURFACE PROTECTION OF GAMMA AND ALPHA-2 TITANIUM ALUMINIDES BY ION IMPLANTATION

STATEMENT OF GOVERNMENT INTEREST

This invention was made with Government support under Contract No. F33657-86-C-2127 awarded by the United States Air Force. The Government has certain rights thereunder.

BACKGROUND OF THE INVENTION

1. Field of the Invention

This invention relates to the protection of gamma and alpha-2 titanium aluminide alloy structures and more particularly to protective coatings for such structures.

2. Description of the Related Art

Titanium aluminide intermetallics are attractive for use in advanced structural applications such as aircraft systems, because they offer a desirable combination of low density and high temperature strength. At high temperatures, however, titanium aluminides presently have very limited use because of their poor oxidation resistance.

The present Applicant, Hoda Shalaby, is the inventor of U.S. Ser. No. 558,945, entitled "Protection of Gamma Titanium Aluminides With Aluminosilicate Coatings", assigned to the present Assignee, which discloses the application of an aluminosilicate glass coating on a surface of a gamma titanium aluminide specimen. The coated specimen is heated to a temperature range of 2150°–2250° F. for a sufficient time period to form a silicide interfacial layer between the alloy and the glass coating. The glass coating results in minimal oxidation during high temperature use. Although it is extremely effective as a protective coating for titanium aluminide alloy structures, it has been the desire of the present Applicant to develop lighter methods using lighter material than the glass coating disclosed in the '945 patent application which would also effectively protect such workpieces against high temperature oxidation.

As will be disclosed in detail below, the process of the present invention involves ion implantation of gamma and alpha-2 titanium aluminides for the purpose of improving oxidation resistance of materials subject to high temperatures. It is noted that previous inventors have utilized ion implantation techniques with titanium and its alloys; however, none of these previously disclosed techniques have been directed to gamma or alpha-2 titanium aluminides or for the purpose of high temperature oxidation resistance. For example, U.S. Pat. No. 4,568,396, entitled "Wear Improvement in Titanium Alloys by Ion Implantation", issued to R. G. Vardiman, discloses a method of making titanium alloy more resistant to sliding wear and fretting fatigue. The method involves implanting carbon ions with at least one energy onto titanium alloy until at least $1 \times 10^{17}$ carbon ions/cm$^2$ have fallen onto the titanium alloy.

U.S. Pat. No. 4,465,524, entitled "Titanium and Its Alloys", issued to G. Dearnaley et al, discloses a workpiece of titanium or an alloy of titanium having a surface treated to improve its wear resistance. The surface is treated by a process comprising the operations of coating the surface with a layer of a metal selected from the group consisting of aluminium, copper, iron, tin, nickel, platinum, zinc and zirconium, and then subjecting the coated surface to bombardment with ions of a species, the mass of which is insufficient to cause a harmful degree of sputtering of the surface during implantation. Preferred ion species are $N^+$, $B^+$, $C^+$, and $Ne^+$.

U.S. Pat. No. 4,289,544, entitled "Inhibition of Fretting Corrosion of Metals", Issued to G. Dearnaley, discloses a process for treating a bearing surface containing titanium to inhibit fretting corrosion and improve the fretting fatigue resistance thereof. An active species having a higher heat of formation of its oxide than titanium is deposited under reduced pressure on a bearing surface. The bearing surface is then heated to a temperature and for a period sufficient to cause the deposited active species to migrate into the bearing surface to provide a surface region thereof containing the active species. The Dearnaley disclosure discloses implantation by an ion bombardment.

As mentioned, the '524, '396, and '544 patents do not direct themselves to lightweight surface protection of gamma and alpha-2 titanium aluminides at high temperatures for oxidation resistance.

OBJECTS AND SUMMARY OF THE INVENTION

The principle object of the present invention is to protect gamma and alpha-2 titanium aluminide alloy workpieces against high temperature oxidation.

Another object of the invention is to provide a lightweight protective surface coating for high temperature gamma and alpha-2 titanium aluminide alloys.

The present invention for protecting alpha-2 and gamma titanium aluminide alloy specimens subjected to high temperature oxidation comprises providing an ion beam having an energy range from about 100 KeV to about 170 KeV. The ion beam incorporates an elemental species capable of promoting alumina formation. The ion beam is exposed to the specimen so as to implant a dose in a range from about $2 \times 10^{16}$ to about $8 \times 10^{17}$ ions/cm$^2$ for a sufficient time period to form a surface alloy of the elemental species and titanium aluminide near the surface of the specimen.

Other objects, advantages and novel features of the present invention will become apparent from the following detailed description of the invention when considered in conjunction with the accompanying drawings.

BRIEF DESCRIPTION OF THE DRAWING

This sole FIGURE is a graph of weight percent versus time for a test specimen ion implanted in accordance with the present invention and subjected to isothermal oxidation at high temperature conditions.

DETAILED DESCRIPTION OF THE PREFERRED EMBODIMENTS

In the practice of the present invention, an ion beam is provided having an energy range from about 100 keV to about 170 keV. The ion beam includes an elemental species capable of promoting alumina ($Al_2O_3$) formation. The preferred elemental species is phosphorous ion. However, other elemental species may be used, including the ions of argon, nitrogen, boron, oxygen, and aluminum.

An alpha-2 or gamma titanium aluminide alloy specimen (i.e. structural component) is exposed to the ion beam. The beam implants a dose in a range from about $2 \times 10^{16}$ to about $8 \times 10^{17}$ ions/cm$^2$ for a sufficient time period to form a surface alloy of the elemental species used and titanium aluminide, near the surface of the specimen.

A gamma titanium aluminide specimen has approximately the following composition:

| By Atom Percent | |
| --- | --- |
| Ti | 49.2 |
| Al | 48.0 |
| Nb | 2.5 |
| Ta | 0.3 |

An alpha-2 titanium aluminide specimen has approximately the following composition:

| By Atom Percent | |
| --- | --- |
| Ti | 61.0 |
| Al | 25.0 |
| Nb | 10.0 |
| V | 3.0 |
| Mo | 1.0 |

EXAMPLE 1

A one centimeter square alpha-2 titanium aluminide specimen was mechanically cleaned. The specimen was exposed to an ion beam of phosphorous ions. The ion beam was in an energy range of about 90–100 keV. The ion implantation dose was in a range from about $7\times10^{17}$ to about $8\times10^{17}$ ions/cm$^2$. Conventional techniques were used for determining when sufficient implantation had been achieved. Implantation was provided on the two side surfaces of the specimen but not on its edges. An isothermal thermalgravimetric analysis (TGA) of the subject specimen was carried out at 1800° F. (982° C.) for 24 hours. The weight gain was monitored. An uncoated alpha-2 titanium aluminide specimen was exposed to the same isothermal conditions. As illustrated in the FIGURE, the ion implanted specimen exhibited very small weight gain (see curve 10), while the uncoated specimen (see curve 12) had a substantial weight gain. (It is predicted that if the ion beam were implanted on the edge surfaces as well as the side surfaces of the specimen, even less weight gain would be attained.)

EXAMPLE 2

A second one centimeter square alpha-2 titanium aluminide specimen was prepared. The second sample was exposed to an ion beam of argon ions. The energy range was from about 150 to about 160 keV. The dose range was from about $1\times10^{17}$ to about $3\times10^{17}$ ions/cm$^2$. This second specimen was provided with the same isothermal conditions/analysis as stated above for the Example 1 specimen. As illustrated in the FIGURE (see curve 14), the argon ion implanted specimen exhibited relatively small weight gain compared to the uncoated case.

EXAMPLE 3

With a nitrogen ion implanted specimen the same results, as in the argon case were achieved, as also illustrated by curve 14 in the FIGURE. With the nitrogen ion implanted case, the energy range was from about 100 to about 110 keV while the dose range was from about $1\times10^{17}$ to about $3\times10^{17}$ ions/cm$^2$. The same isothermal TGA was conducted.

EXAMPLES 4 AND 5

The same results for boron ion implantation and oxygen ion implantation were achieved as the results for nitrogen and argon, as shown in the FIGURE (curve 14). For the boron ion beam the energy range was from about 90 to 100 KeV while the dose range was from about $7\times10^{17}$ to about $8\times10^{17}$ ions/cm$^2$.

For the oxygen ion implantation, the energy range was from about 90 to about 100 keV and the dose range was from about $7\times10^{17}$ to $8\times10^{17}$ ions/cm$^2$.

EXAMPLE 6

Aluminum ions were implanted at an energy range from about 150 to 160 keV and a dose range from about $6\times10^{17}$ to about $7\times10^{17}$ ions/cm$^2$. Oxygen ions were then implanted in the same specimen in an energy range from about 90 to 100 KeV and a dose range from about $7\times10^{17}$ to about $8\times10^{17}$ ions/cm$^2$. The results achieved are designated by curve 16 in the FIGURE. In this instance, the results were not as good as the previous examples; however, the weight percent gain is still significantly less than an uncoated specimen.

Obviously, many modifications and variations of the present invention are possible in light of the above teachings. It is therefore to be understood that, within the scope of the appended claims, the invention may be practiced otherwise than as specifically described.

What is claimed and desired to be secured by Letters Patent of the United States is:

1. A process for protecting an alpha-2 or gamma titanium aluminide alloy specimen subject to high temperature oxidation, comprising the steps of:
   a) providing an ion beam having an energy range from about 100 keV to about 170 keV, said ion beam incorporating an elemental species capable of promoting alumina formation; and
   b) exposing said specimen to said ion beam so as to implant a dose in a range from about $2\times10^{16}$ to about $8\times10^{17}$ ions/cm$^2$ for a sufficient time period to form a surface alloy of said elemental species and titanium aluminide near the surface of said specimen.

2. The process of claim 1 wherein said step of providing an ion beam includes providing an ion beam incorporating a phosphorous ion.

3. The process of claim 1 wherein said step of providing an ion beam includes providing an ion beam incorporating an argon ion.

4. The process of claim 1 wherein said step of providing an ion beam includes providing an ion beam incorporating a nitrogen ion.

5. The process of claim 1 wherein said step of providing an ion beam includes providing an ion beam incorporating a boron ion.

6. The process of claim 1 wherein said step of providing an ion beam includes providing an ion beam incorporating an oxygen ion.

7. The process of claim 1 wherein said step of providing an ion beam includes providing an ion beam incorporating an aluminum ion.

8. A process for forming a reduced density, high temperature strength structural component, comprising the steps of:
   a) providing an alpha-2 or gamma titanium aluminide alloy specimen;
   b) providing an ion beam having an energy range from about 100 keV to about 170 keV, said ion beam incorporating an elemental species capable of promoting alumina formation; and
   c) exposing said specimen to said ion beam so as to implant a dose in a range from about $2\times10^{16}$ to about $8\times10^{17}$ ions/cm$^2$ for a sufficient time period to form a surface alloy of said elemental species and titanium aluminide near the surface of said specimen.

9. The process of claim 8 wherein said step of providing an ion beam includes providing an ion beam incorporating a phosphorous ion.

10. The process of claim 8 wherein said step of providing an ion beam includes providing an ion beam incorporating an argon ion.

11. The process of claim 8 wherein said step of providing an ion beam includes providing an ion beam incorporating a nitrogen ion.

12. The process of claim 8 wherein said step of providing an ion beam includes providing an ion beam incorporating a boron ion.

13. The process of claim 8 wherein said step of providing an ion beam includes providing an ion beam incorporating an oxygen ion.

14. The process of claim 8 wherein said step of providing an ion beam includes providing an ion beam incorporating an aluminum ion.

* * * * *